United States Patent
Ouyang

(10) Patent No.: US 11,089,201 B2
(45) Date of Patent: *Aug. 10, 2021

(54) DUAL-CORE FOCUSING IMAGE SENSOR, FOCUSING CONTROL METHOD FOR THE SAME, AND ELECTRONIC DEVICE

(71) Applicant: GUANGDONG OPPO MOBILE TELECOMMUNICATIONS CORP., LTD., Guangdong (CN)

(72) Inventor: Dan Ouyang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/854,692

(22) Filed: Apr. 21, 2020

(65) Prior Publication Data

US 2020/0252540 A1 Aug. 6, 2020

Related U.S. Application Data

(63) Continuation of application No. 15/893,976, filed on Feb. 12, 2018, now Pat. No. 10,674,068.

(30) Foreign Application Priority Data

Apr. 28, 2017 (CN) .......................... 201710297649.8

(51) Int. Cl.
*H04N 5/232* (2006.01)
*G02B 7/34* (2021.01)
(Continued)

(52) U.S. Cl.
CPC ......... *H04N 5/23212* (2013.01); *G02B 7/346* (2013.01); *G03B 7/099* (2013.01);
(Continued)

(58) Field of Classification Search
CPC .. H04N 5/23212; H04N 5/3696; H04N 5/335; H04N 5/2253; H04N 5/332;
(Continued)

(56) References Cited

U.S. PATENT DOCUMENTS 7,123,298 B2 10/2006 Schroeder
9,059,064 B2 6/2015 Raynor
(Continued)

FOREIGN PATENT DOCUMENTS

CN 1501507 A 6/2004
CN 102625053 A 8/2012
(Continued)

OTHER PUBLICATIONS

European Patent Application No. 18160874.6 extended Search and Opinion dated Oct. 5, 2018, 9 pages.
(Continued)

*Primary Examiner* — Pritham D Prabhakher
(74) *Attorney, Agent, or Firm* — Lathrop GPM LLP

(57) ABSTRACT

The present disclosure discloses a dual-core focusing image sensor, a focusing control method for the same and an electronic device. The dual-core focusing image sensor includes an array of photosensitive pixels, an array of filter units arranged on the array of photosensitive pixels and an array of micro lenses arranged above the array of filter units. The array of micro lenses includes at least one first micro lens and a plurality of second micro lenses, each second micro lens is corresponding to one photosensitive pixel, each first micro lens is corresponding to one focusing photosensitive unit, each focusing photosensitive unit includes N*N photosensitive pixels, and at least a part of the focusing photosensitive unit is covered by a white filter unit, where N is an even number greater than or equal to 2.

20 Claims, 5 Drawing Sheets

(51) Int. Cl.
  *G03B 7/099* (2021.01)
  *H01L 27/146* (2006.01)
  *H04N 5/369* (2011.01)
  *G02B 3/00* (2006.01)
  *G02B 5/20* (2006.01)

(52) U.S. Cl.
  CPC .. *H01L 27/14621* (2013.01); *H01L 27/14627* (2013.01); *H01L 27/14645* (2013.01); *H04N 5/3696* (2013.01); *G02B 3/0043* (2013.01); *G02B 5/201* (2013.01)

(58) Field of Classification Search
  CPC .............. H04N 9/045; H01L 27/14645; H01L 27/14621; H01L 27/14627; H01L 27/14685; H01L 27/14687; H01L 27/1446; H01L 27/14603; H01L 27/14625; H01L 27/14632; H01L 27/14643; H01L 27/14689; H01L 31/0232; G03B 7/099; G02B 7/346; G02B 5/201; G02B 3/0043
  USPC ......................................................... 348/350
  See application file for complete search history.

(56) References Cited

U.S. PATENT DOCUMENTS

| | | | |
|---|---|---|---|
| 9,515,105 B2* | 12/2016 | Barna | H01L 27/14654 |
| 9,578,257 B2 | 2/2017 | Attar et al. | |
| 9,973,682 B2* | 5/2018 | Ham | H04N 5/374 |
| 10,044,959 B2* | 8/2018 | Galor Gluskin | H04N 9/04515 |
| 10,070,042 B2* | 9/2018 | Nikkanen | H04N 17/002 |
| 10,270,996 B2 | 4/2019 | Lee | |
| 10,276,615 B2* | 4/2019 | Shibuta | H04N 5/36961 |
| 2005/0134698 A1 | 6/2005 | Schroeder | |
| 2008/0087800 A1 | 4/2008 | Toda | |
| 2011/0019048 A1 | 1/2011 | Raynor et al. | |
| 2013/0224897 A1* | 8/2013 | Ishioka | H01L 31/02325 438/70 |
| 2014/0347532 A1 | 11/2014 | Kang et al. | |
| 2015/0062390 A1 | 3/2015 | Kim et al. | |
| 2016/0202522 A1 | 7/2016 | Lee | |
| 2016/0205311 A1* | 7/2016 | Mandelli | H04N 9/04557 348/349 |
| 2017/0019584 A1 | 1/2017 | Ham | |
| 2017/0026622 A1 | 1/2017 | Yoon et al. | |
| 2017/0084655 A1 | 3/2017 | Shibuta | |
| 2017/0094153 A1* | 3/2017 | Wang | G02B 7/365 |
| 2017/0094210 A1 | 3/2017 | Galor Gluskin | |
| 2017/0264811 A1* | 9/2017 | Ollila | H04N 5/232122 |
| 2018/0063456 A1 | 3/2018 | Lee | |
| 2018/0176452 A1 | 6/2018 | Mikkanen | |

FOREIGN PATENT DOCUMENTS

| | | |
|---|---|---|
| CN | 104241310 A | 12/2014 |
| CN | 104253136 A | 12/2014 |
| CN | 104412580 A | 3/2015 |
| CN | 104425635 A | 3/2015 |
| CN | 104429056 A | 3/2015 |
| CN | 105516697 A | 4/2016 |
| CN | 105611124 A | 5/2016 |
| CN | 106062607 A | 10/2016 |
| CN | 106358026 A | 1/2017 |
| CN | 107040724 A | 8/2017 |
| JP | 2008152012 A | 7/2008 |
| JP | 2012113027 A | 6/2012 |
| JP | 2012208160 A | 10/2012 |
| JP | 2015050467 A | 3/2015 |
| JP | 2015076475 A | 4/2015 |
| JP | 2016052041 A | 4/2016 |
| KR | 101373132 B1 | 3/2014 |
| KR | 20140136727 A | 12/2014 |
| KR | 101492624 B1 | 2/2015 |
| TW | 201512732 A | 4/2015 |
| WO | WO 2016035566 A1 | 3/2016 |

OTHER PUBLICATIONS

European Patent Application No. 18160874.6 Office Action dated Jul. 11, 2019, 4 pages.
PCT/CN2018/081126 International Search Report and Written Opinion dated Jun. 21, 2018, 12 pages.
Taiwanese Patent Application No. 106142210, Office Action dated May 18, 2018, 4 pages.
Taiwanese Patent Application No. 106142210, English translation of Office Action dated May 18, 2018, 4 pages.
Chinese Patent Application No. 201710297649.8 Office Action dated Apr. 2, 2019, 10 pages.
Chinese Patent Application No. 201710297649.8 English translation of Office Action dated Apr. 2, 2019, 13 pages.
U.S. Appl. No. 15/893,976 Office Action dated Nov. 6, 2019, 21 pages.
U.S. Appl. No. 15/893,976 Notice of Allowance dated Jan. 21, 2020, 17 [ages.
Korean Patent Application No. 10-2019-7018805 Office Action dated Apr. 21, 2020, 7 pages.
Korean Patent Application No. 10-2019-7018805 English translation of Office Action dated Apr. 21, 2020, 7 pages.
Japanese Patent Application No. 2019-540614 Decision to Grant dated Aug. 28, 2020, 3 pages.
Japanese Patent Application No. 2019-540614 English translation of Decision to Grant dated Aug. 28, 2020, 2 pages.
Indian Patent Application No. 201834008812 Office Action dated May 11, 2020, 7 pages.
European Patent Application No. 20166934.8 extended Search Report and Opinion dated Jul. 10, 2020, 8 pages.

* cited by examiner

DUAL-CORE FOCUSING IMAGE SENSOR, FOCUSING CONTROL METHOD FOR THE SAME, AND ELECTRONIC DEVICE

CROSS-REFERENCE TO RELATED APPLICATIONS

This application is a continuation application of U.S. patent application Ser. No. 15/893,976, filed on Feb. 12, 2018, which claims priority to Chinese Patent Application No. 201710297649.8, filed on Apr. 28, 2017. The entire contents of each of the aforementioned applications are incorporated herein by reference.

FIELD

The present disclosure relates to the image device technology field, and more particularly to a dual-core focusing image sensor, a focusing control method for the same, and an electronic device.

BACKGROUND

In the related art, Dual Pixel Autofocus technology has become the most advanced focusing technology on the market. Compared with contrast focusing, laser focusing and phase focusing technologies, the Dual Pixel Autofocus technology has faster focusing speed and wider focusing range. In addition, in the Dual Pixel Autofocus technology, since "dual-core" photodiodes are "merged" as one pixel to output during imaging, performance of focusing can be guaranteed without affecting the image quality.

However, when using the Dual Pixel Autofocus technology, since there are two photodiodes for each pixel, the amount of light is reduced, thus causing it difficult to perform a dual-core focusing in low light environment.

SUMMARY

Embodiments of a first aspect of the present disclosure provide a focusing control method for a dual-core focusing image sensor. The dual-core focusing image sensor includes an array of photosensitive pixels, an array of filter units arranged on the array of photosensitive pixels, and an array of micro lenses arrange above the array of filter units. The array of photosensitive pixels includes at least one first micro lens and a plurality of second micro lenses, each second micro lens is corresponding to one photosensitive pixel, and each first micro lens is corresponding to one focusing photosensitive unit. Each focusing photosensitive unit includes N*N photosensitive pixels, and at least a part of the focusing photosensitive unit is covered by a white filter unit, where N is an even number greater than or equal to 2. The method includes: controlling the array of photosensitive pixels to enter a focus mode; obtaining first phase difference information of the focusing photosensitive unit and second phase difference information of the photosensitive pixel corresponding to the second micro lens; and performing focusing control according to the first phase difference information and the second phase difference information.

Embodiments of a second aspect of the present disclosure provide a dual-core focusing image sensor, including an array of photosensitive pixels, an array of filter units arranged on the array of photosensitive pixels and an array of micro lenses arranged above the array of filter units. The array of micro lenses includes at least one first micro lens and a plurality of second micro lenses, each second micro lens is corresponding to one photosensitive pixel, each first micro lens is corresponding to one focusing photosensitive unit, each focusing photosensitive unit includes N*N photosensitive pixels, and at least a part of the focusing photosensitive unit is covered by a white filter unit, where N is an even number greater than or equal to 2.

Embodiments of a third aspect of the present disclosure provide an electronic device. The electronic device includes the dual-core focusing image sensor according to the embodiments of the first aspect of the present disclosure and a controller. The controller is configured to: control the array of photosensitive pixels to enter a focus mode; generate first phase difference information of the focusing photosensitive unit and second phase difference information of the photosensitive pixel corresponding to the second micro lens; and perform focusing control according to the first phase difference information and the second phase difference information.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

EMBODIMENTS OF THE PRESENT DISCLOSURE

Figure 1:
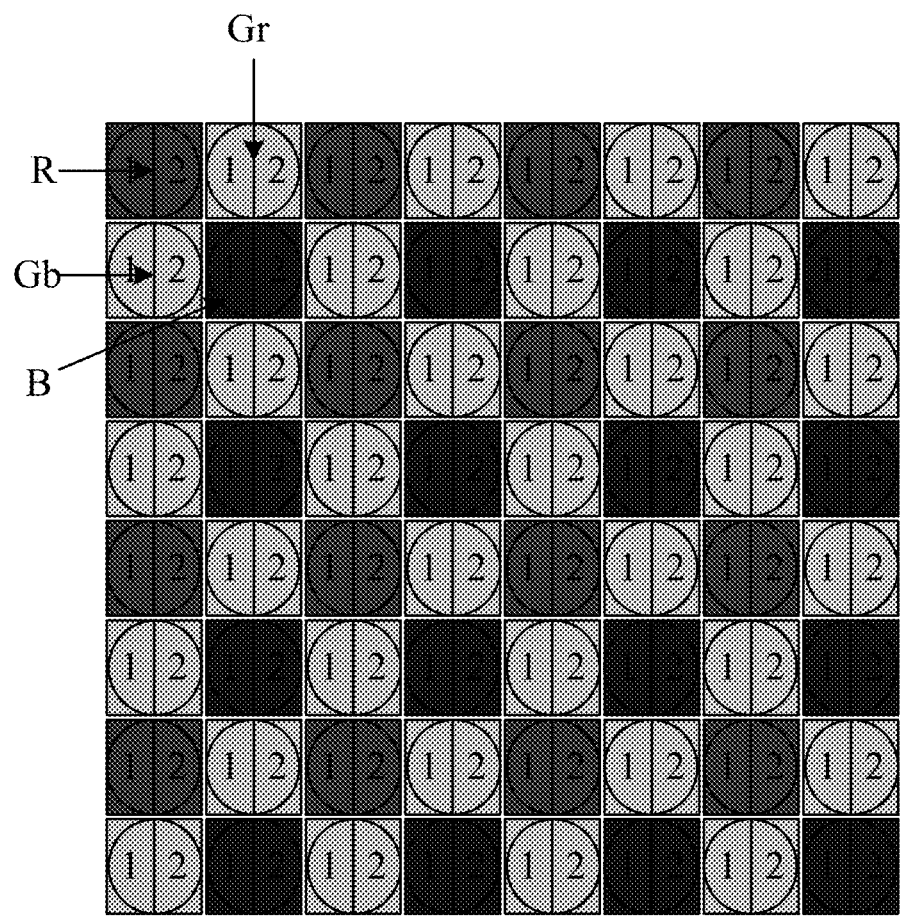
FIG. 1 is a schematic diagram of a dual-core focusing image sensor in the related art.

Reference will now be made in detail to exemplary embodiments, examples of which are illustrated in accompanying drawings, in which the same or similar reference numbers throughout the drawings represent the same or similar elements or elements having same or similar functions. Embodiments described below with reference to drawings are merely exemplary and used for explaining the present disclosure, and should not be understood as limitation to the present disclosure.

The present disclosure is related to a focusing control method for a dual-core focusing image sensor. The dual-core focusing image sensor includes an array of photosensitive pixels, an array of filter units arranged on the array of photosensitive pixels, and an array of micro lenses arrange above the array of filter units. The array of photosensitive pixels includes at least one first micro lens and a plurality of second micro lenses, each second micro lens is corresponding to one photosensitive pixel, and each first micro lens is corresponding to one focusing photosensitive unit. Each focusing photosensitive unit includes N*N photosensitive pixels, and at least a part of the focusing photosensitive unit is covered by a white filter unit, where N is an even number greater than or equal to 2. The method includes: controlling the array of photosensitive pixels to enter a focus mode; obtaining first phase difference information of the focusing photosensitive unit and second phase difference information of the photosensitive pixel corresponding to the second micro lens; and performing focusing control according to the first phase difference information and the second phase difference information.

The present disclosure is further related to a dual-core focusing image sensor. The dual-core focusing image sensor includes an array of photosensitive pixels, an array of filter units arranged on the array of photosensitive pixels and an array of micro lenses arranged above the array of filter units. The array of micro lenses includes at least one first micro lens and a plurality of second micro lenses, each second micro lens is corresponding to one photosensitive pixel, each first micro lens is corresponding to one focusing photosensitive unit, each focusing photosensitive unit includes N*N photosensitive pixels, and at least a part of the focusing photosensitive unit is covered by a white filter unit, where N is an even number greater than or equal to 2.

The present disclosure is further related to an electronic device. The electronic device includes a dual-core focusing image sensor and a controller. The dual-core focusing image sensor includes an array of photosensitive pixels, an array of filter units arranged on the array of photosensitive pixels and an array of micro lenses arranged above the array of filter units. The array of micro lenses includes at least one first micro lens and a plurality of second micro lenses, each second micro lens is corresponding to one photosensitive pixel, each first micro lens is corresponding to one focusing photosensitive unit, each focusing photosensitive unit includes N*N photosensitive pixels, and at least a part of the focusing photosensitive unit is covered by a white filter unit, where N is an even number greater than or equal to 2. The controller is configured to: control the array of photosensitive pixels to enter a focus mode;
generate first phase difference information of the focusing photosensitive unit and second phase difference information of the photosensitive pixel corresponding to the second micro lens; and perform focusing control according to the first phase difference information and the second phase difference information.

The present disclosure is further related to an electronic device. The electronic device includes a housing, a processor, a memory, a circuit board and a power supply circuit. The circuit board is arranged inside a space enclosed by the housing. The processor and the memory are arranged on the circuit board. The power supply circuit is configured to provide power for respective circuits or components of the electronic device. The memory is configured to store executable program codes. The processor is configured to run a program corresponding to the executable program codes by reading the executable program codes stored in the memory, to perform the above-mentioned focusing control method.

The dual-core focusing image sensor, the focusing control method for the dual-core focusing image sensor, and the electronic device according to embodiments of the present disclosure will be described below with reference to accompanying drawings.

The Dual Pixel Autofocus technology is the most advanced focusing technology on the market. FIG. 1 illustrates the structure of the dual-core focusing sensor used in this focusing technology. As illustrated in FIG. 1, each micro lens (in FIG. 1, circles represent micro lenses) corresponds to one photosensitive pixel, and each photosensitive pixel has two photodiodes. In an imaging process, values of "1" and "2" are added to obtain a single-component pixel value. In a focusing process, the values of "1" and "2" are read respectively, and a driving force and a driving direction of the lens can be determined by calculating a phase difference between the values of "1" and "2".

It may be understood that, with an increase of the total number of pixels, photosensitive areas corresponding to "1" and "2" become smaller, so that the amount of passed light is reduced, the phase information is easily drowned by noise in the low light environment, and it is difficult to perform focusing in the low light environment.

Therefore, in order to solve the problem in the Dual Pixel Autofocus technology in the related art that the focusing is difficult in the low light environment, the present disclosure provides a dual-core focusing image sensor, which can increase the amount of light passing through the focusing pixel, and effectively improve a focusing speed in low light environment, while ensuring an accuracy of color reduction of an image.

In the following, the dual-core focusing image sensor according to embodiments of the present disclosure is described.

Figure 2:
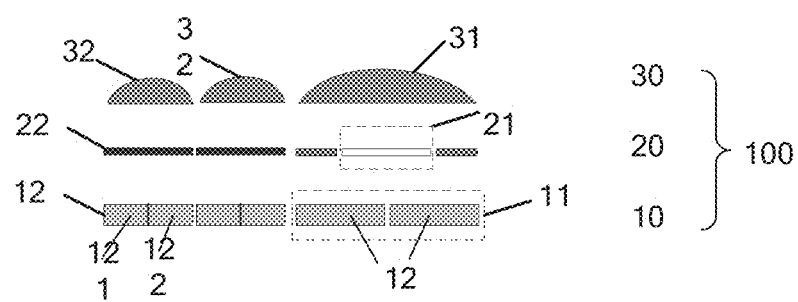
FIG. 2 is a section view of a dual-core focusing image sensor according to an embodiment of the present disclosure.
Figure 3:
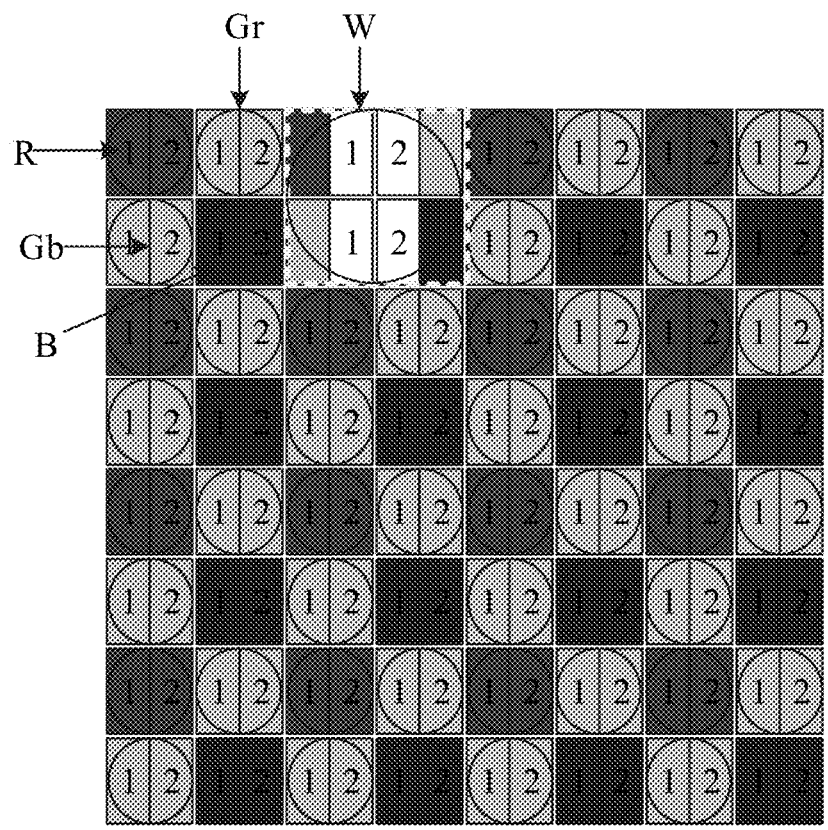
FIG. 3 is a top view of a dual-core focusing image sensor according to an embodiment of the present disclosure.

FIG. 2 is a section view of a dual-core focusing image sensor according to an embodiment of the present disclosure. FIG. 3 is a top view of a dual-core focusing image sensor according to an embodiment of the present disclosure.

As illustrated in FIG. 2 and FIG. 3, the dual-core focusing image sensor 100 includes an array 10 of photosensitive pixels, an array 20 of filter units and an array 30 of micro lenses. The array 20 of filter units is arranged on the array 10 of photosensitive pixels, and the array 30 of micro lenses is arranged above the array 20 of filter units. The array 30 of micro lenses includes at least one first micro lens 31 and a plurality of second micro lenses 32. Each second micro lens is corresponding to one photosensitive pixel 12. Each first micro lens 31 is corresponding to one filter unit 22 and one focusing photosensitive unit 11. Each focusing photosensitive unit 11 includes N*N photosensitive pixels 12. In an embodiment, as illustrated in FIG. 3, one focusing photosensitive unit 11 (the area enclosed by dotted lines in FIG. 3) includes 2*2 photosensitive pixels 12. At least a part of the focusing photosensitive unit 11 is covered by a white filter unit 21. In the present disclosure, "covered by a white filter unit" could be understood in broad sense. For example, in an embodiment of the present disclosure, at least a part of the focusing photosensitive unit is not covered by a filter unit. As illustrated in FIG. 2, the filter unit in the part 21 may be removed or may be replaced by a white filter unit. In an embodiment, the photosensitive pixel under the part 21 can be referred to as "white" pixel.

The photosensitive pixel 12 has two photodiodes, which are a first photodiode 121 and a second photodiode 122 respectively. The first photodiode 121 and the second photodiode 122 correspond to "1" and "2" of each photosensitive pixel 12 in FIG. 3, respectively.

In embodiments of the present disclosure, the photosensitive pixels 12 are arranged in a Bayer array. By using the Bayer structure, the conventional algorithm for the Bayer structure can be used to process image signals, so that there is no need to make great adjustment in terms of hardware structure.

In embodiments of the present disclosure, the white filter unit 21 covers the right half of the left N photosensitive pixels and the left half of the right N photosensitive pixels in the focusing photosensitive unit 11, or covers the lower half of the upper N photosensitive pixels and the upper half of the lower N photosensitive pixels in the focusing photosensitive unit 11. The size and position covered by the white filter unit 21 in the focusing photosensitive unit 11 is not limited in the present disclosure. As illustrated in FIG. 3, in an embodiment of the present disclosure, the white filter unit 21 (i.e. W in FIG. 3) covers the right half of the left 2 photosensitive pixels and the left half of the right 2 photosensitive pixels in the focusing photosensitive unit 11, and remaining part is formed of general filter units.

In general, in the dual-core focusing image sensor 100 according to the embodiments of the present disclosure, N*N photosensitive pixels 110 form one group and share one first micro lens 31, and the white filter unit 21 covers a part of the focusing photosensitive unit 11. The array 30 of micro lenses may include a plurality of first micro lenses 31.

Figure 4:
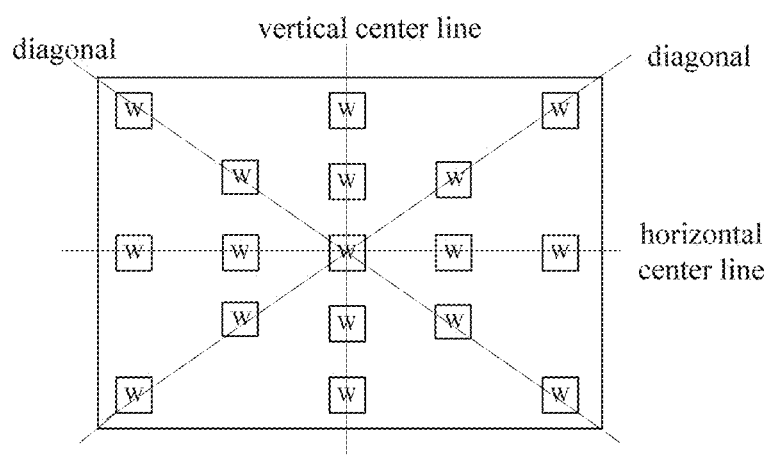
FIG. 4 is a diagram illustrating a density arrangement of first micro lenses.

For ease of understanding, the arrangement of first micro lenses 31 in the array 30 of micro lenses will be described below with reference to accompanying drawings. FIG. 4 is a schematic diagram illustrating a density arrangement of first micro lenses. As illustrated in FIG. 4, the white filter units 21 covered by the first micro lenses 31 (i.e., W in FIG. 4) are scattered in the whole dual-core focusing image sensor, and occupy 3% to 5% of the total number of pixels. The closer it is from the center of the array of micro lenses, the white filter units are arranged more densely, and the farther it is from the center of the array of micro lenses, the white filter units are arranged more sparsely, which gives priority to focusing accuracy and speed in the middle area of the picture, and effectively improves the focusing speed without affecting the image quality.

In an embodiment of the present disclosure, the array 30 of micro lenses includes a horizontal center line and a vertical center line. The plurality of first micro lenses 31 include a first group of first micro lenses 31 arranged along the horizontal center line and a second group of first micro lenses 31 arranged along the vertical center line.

In an embodiment of the present disclosure, the array of micro lenses 30 may further include two diagonals. In this case, the plurality of first micro lenses 31 also include a third group of first micro lenses 31 arranged along the two diagonals.

It should be noted that, W in FIG. 3 and FIG. 4 indicates that larger amount of passed light can be obtained when the white filter unit 21 is used.

Figure 5:
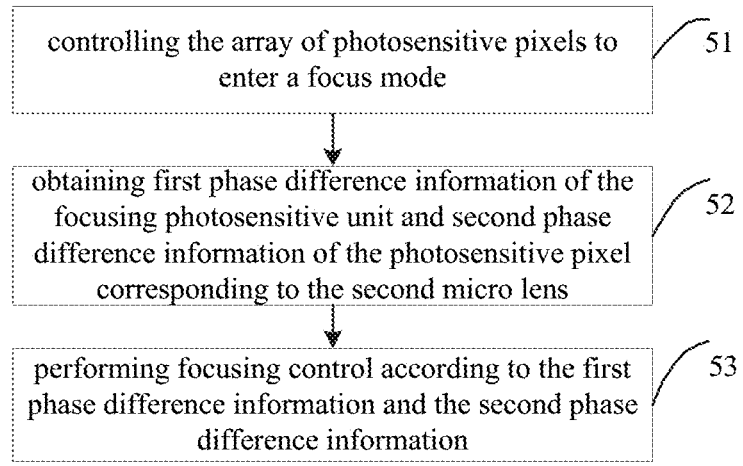
FIG. 5 is a flow chart of a focusing control method for a dual-core focusing image sensor according to an embodiment of the present disclosure.

Based on the structure of the dual-core focusing image sensor in FIG. 2 to FIG. 4, the focusing control method for the dual-core focusing image sensor according to embodiments of the present disclosure is described below. FIG. 5 is a flow chart of a focusing control method for a dual-core focusing image sensor according to an embodiment of the present disclosure. As illustrated in FIG. 5, the method may include the following.

At block 51, the array of photosensitive pixels is controlled to enter a focus mode.

When a camera is used to take pictures, and a sharpness of the picture is insufficient, the array of photosensitive pixels can be controlled to enter the focus mode, thus improving the sharpness of the picture by focusing.

At block 52, first phase difference information of the focusing photosensitive unit and second phase difference information of the photosensitive pixel corresponding to the second micro lens (the dual-core focusing photosensitive pixel) are obtained.

In an embodiment of the present disclosure, after entering the focus mode, the first phase difference information of the focusing photosensitive unit and the second phase difference information of the photosensitive pixel corresponding to the second micro lens may be obtained.

In at least one embodiment of the present disclosure, the first phase difference information of the focusing photosensitive unit may be obtained as follows. Output values of a first part of photosensitive pixels in the focusing photosensitive unit are read as a first output value, output values of a second part of photosensitive pixels in the focusing photosensitive unit are read as a second output value, and the first phase difference information is obtained according to the first output value and the second output value.

It should be noted that, in embodiments of the present disclosure, obtaining the first phase difference information of the focusing photosensitive pixel may refer to obtaining the first phase difference information of the part of the focusing photosensitive unit covered by the white filter unit.

Figure 6:
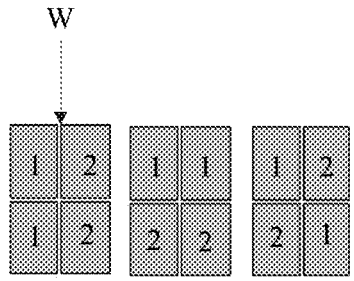
FIG. 6 is a schematic diagram illustrating a dividing effect of 2*2 photosensitive pixels covered by a white filter unit in a focusing photosensitive unit according to an embodiment of the present disclosure.

With reference to FIG. 3 and FIG. 6, illustration will be made below by taking the focusing photosensitive unit including 2*2 photosensitive pixels, and the white filter unit covering the right half of the left 2 photosensitive pixels and the left half of the right 2 photosensitive pixels in the focusing photosensitive unit as an example. The area covered by the white filter unit (the white part in FIG. 3, denoted by W) in the focusing photosensitive unit can be divided from different viewpoints. As illustrated in FIG. 6, W is divided along a vertical direction, along a horizontal direction and along a diagonal, respectively.

In a first example, W is divided along the vertical direction.

In this embodiment, W is divided into two parts which are left and right parts. The output values of two "1"s in the left part of W are obtained as the first output value, and the output values of two "2"s in the right part of W are obtained as the second output value.

In a second example, W is divided along the horizontal direction.

In this embodiment, W is divided into two parts which are upper and lower parts. The output values of two "1"s in the upper part of W are obtained as the first output value, and the output values of two "2"s on the lower part of W are obtained as the second output value.

In a third example, W is divided along the diagonal.

In this embodiment, W is divided into two parts along the two diagonals. The output values of two "1"s in the upper left and the lower right parts of W are obtained as the first output value, and the output values of two "2"s in the lower left and the upper right parts are obtained as the second output value.

In embodiments of the present disclosure, after the first output value and the second output value are obtained, the first phase information can be obtained according to the first output value and the second output value.

For example, the output values of the two "1"s in the left part of W are added to generate the first phase information, and the output values of the two "2"s in the right part of W are added to generate the second phase information. Finally, the first phase difference information may be obtained by calculating the difference value between the first phase information and the second phase information.

In embodiments of the present disclosure, by taking the output values of the left part and the right part of the area covered by the white filter unit in the focusing photosensitive unit as the first output value and the second output value respectively, the first phase difference information in a left/right direction can be detected. By taking the output values of the upper part and the lower part of the area covered by the white filter unit in the focusing photosensitive unit as the first output value and the second output value respectively, the first phase difference information in an up/down direction can be detected. By taking the output values of the two diagonal parts of the area covered by the white filter unit in the focusing photosensitive unit as the first output value and the second output value respectively, the first phase difference information in a diagonal direction can be detected.

In at least one embodiment of the present disclosure, the second phase difference information of the dual-core focus photosensitive pixel may be obtained as follows. An output value of the first photodiode is obtained as a third output value, an output value of the second photodiode is obtained as a fourth output value, and the second phase difference information is obtained according to the third output value and the fourth output value.

Still taking FIG. 3 as an example, for respective dual-core focus photosensitive pixels, the second phase difference information is calculated in the same manner. Here, the second phase difference information at Gr in FIG. 3 is illustrated as an example. The output value of "1" at Gr is read as the third output value first, and then the output value of "2" at Gr is read as the fourth output value. The second phase difference information is obtained according to the third output value and the fourth output value. For example, the second phase difference information can be obtained by calculating the difference value between the third output value and the fourth output value.

At block 53, focusing control is performed according to the first phase difference information and the second phase difference information.

In embodiments of the present disclosure, after the first phase difference information of the focusing photosensitive unit and the second phase difference information of the dual-core focus photosensitive pixel are obtained, the focusing control can be performed according to the first phase difference information and the second phase difference information.

In the conventional dual-core focusing technology, the phase difference value is usually calculated according to the output values of two photodiodes in the dual-core focus photosensitive pixel, thereby calculating the driving force and the driving direction of the lens to achieve focusing. In the low light environment, the focusing speed is slow.

In embodiments of the present disclosure, one first micro lens is corresponding to one white filter unit, and one white filter unit is corresponding to one focusing photosensitive unit. By adapting the white filter unit, a larger amount of passed light can be obtained in the low light environment, thus improving the focusing speed in the low light environment.

In the present disclosure, by inserting some larger micro lenses in the array of micro lenses and placing the white filter unit on a part of the focusing photosensitive unit, and by reading the first phase difference information of the focusing photosensitive unit and the second phase difference information of the dual-core focus photosensitive pixel, and performing focusing control according to the first phase difference information and the second phase difference information, it is possible to increase the amount of light passing through the focusing pixels, and effectively improve the focusing speed in low light environment, while ensuring the accuracy of color reduction of the image.

Figure 7:
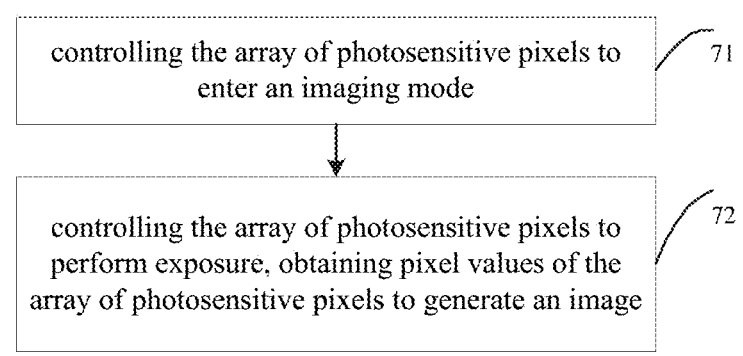
FIG. 7 is a flow chart of a focusing control method for a dual-core focusing image sensor according to another embodiment of the present disclosure.

It should be understood that, the purpose of focusing is to obtain pictures with higher definition. In an actual application, after the focusing processing is completed, the imaging processing may be performed. Therefore, as illustrated in FIG. 7, and on the basis of FIG. 5, after block 53, the method further includes followings.

At block 71, the array of photosensitive pixels is controlled to enter an imaging mode.

In embodiments of the present disclosure, after the focusing control is completed, the array of photosensitive pixels can be controlled to enter the imaging mode.

At block 72, the array of photosensitive pixels is controlled to perform exposure, pixel values of the array of photosensitive pixels are obtained, and an image is generated.

The pixel values of the part of the focusing photosensitive unit covered by the white filter unit are obtained by an interpolation algorithm.

In embodiments of the present disclosure, after the array of photosensitive pixels enters the imaging mode, the array of photosensitive pixels is controlled to perform exposure, the pixel values of the array of photosensitive pixels are obtained by reading the output values of the array of photosensitive pixels, and then the image is generated.

In an embodiment of the present disclosure, for the dual-core focusing photosensitive pixel (i.e., the photosensitive pixel corresponding to the second micro lens), the pixel value is obtained by reading the output values of two photodiodes in the dual-core focusing photosensitive pixel and adding the output values and the two photodiodes. For the part of the focusing photosensitive unit covered by the white filter unit, the pixel value is obtained by an interpolation algorithm. In an embodiment of the present disclosure, the interpolation algorithm may be any one of a nearest neighbor interpolation algorithm, a bilinear interpolation algorithm, and a cubic convolution interpolation algorithm.

For simplicity, the pixel values of the focusing photosensitive unit can be obtained by the nearest neighbor interpolation algorithm.

Figure 8:
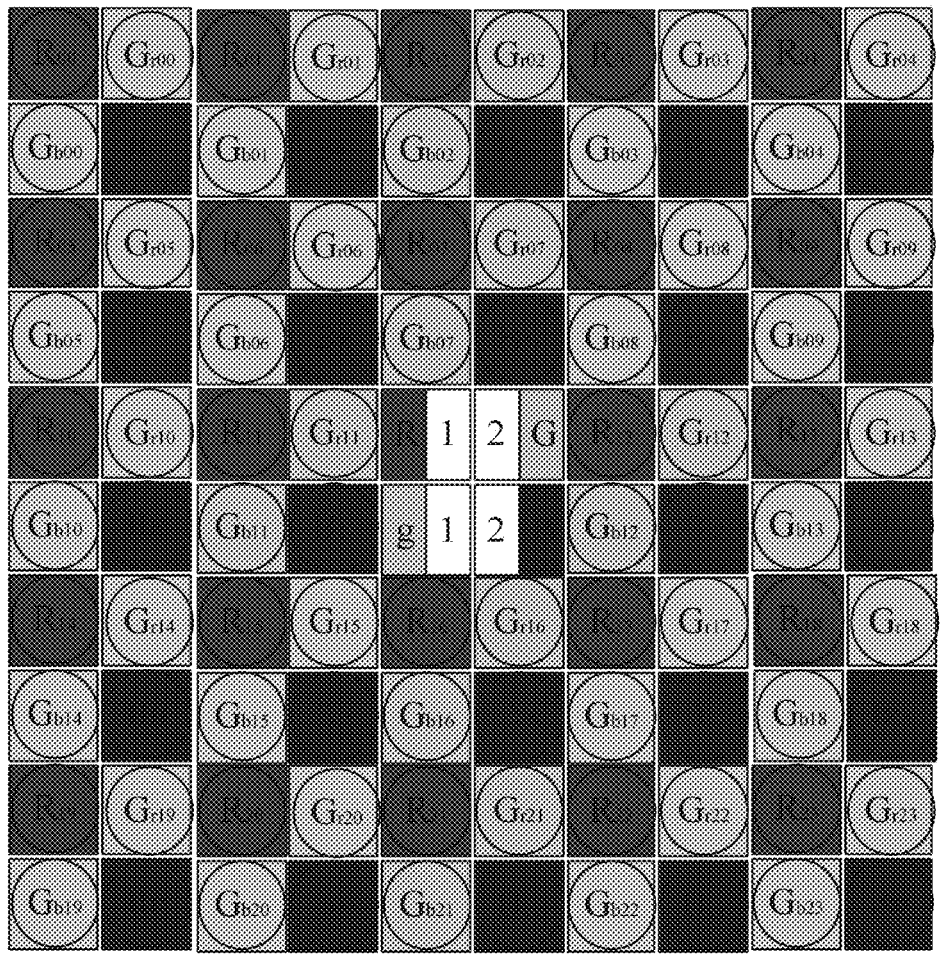
FIG. 8 is a schematic diagram of obtaining pixel values of a focusing photosensitive unit by an interpolation algorithm.

FIG. 8 is a schematic diagram of obtaining pixel values of a focusing photosensitive unit by an interpolation algorithm.

As illustrated in FIG. 8, in the focusing photosensitive unit including 2*2 photosensitive pixels, the white filter unit (the white area in FIG. 8) covers the right half of the left 2 photosensitive pixels and the left half of the right 2 photosensitive pixels in the focusing photosensitive unit. In order to output images with better quality, it is necessary to obtain the output value of the covered part in each photosensitive pixel by interpolation, i.e., it is necessary to obtain RGB values of the covered part in each photosensitive pixel by interpolation. An average value of neighboring pixels may be taken as the pixel value of the covered part in the photosensitive pixel. In an example, the RGB values at upper left "1" in the white filter unit are calculated. For convenience of description, the R pixel value at upper left "1" is denoted as $R_{10}$, the G pixel value is denoted as $G_{10}$, and the B pixel value is denoted as Bio. The formulas are as follows.

$$R_{10} = R$$
$$G_{10} = \frac{G_{r11} + G_{b07} + 2g + 2G}{4} \times \frac{1}{2}$$
$$B_{10} = \frac{B_{06} + B_{07} + B_{11} + 2B}{4} \times \frac{1}{2}$$

It should be noted that, the RGB values at lower left "1", upper right "2" and lower right "2" in the white filter unit may be calculated similar to those of the upper left "1", which are obtained by interpolation based on neighboring pixel points and will not be elaborated herein.

It should be noted that, the foregoing description of the algorithm for obtaining the pixel values of the focusing photosensitive unit is only used to explain the present disclosure, and should not be understood as limitation to the present disclosure. In actual processing, in order to obtain more accurate pixel values, the neighboring pixels can be understood in a board sense. For example, as illustrated in FIG. 8, $R_{11}$, $R_{07}$ and the like may also be used to calculate the pixel value of the upper left "1". In an embodiment of the present disclosure, a higher weight is assigned to the pixel values of pixels nearer to the white filter unit-covered part of the photosensitive pixel, and a less weight is assigned to the pixel values of pixels farther from the covered part of the photosensitive pixel. In other words, the weight of the pixel value is inversely proportional to the distance from the pixel to the white filter unit-covered part of the photosensitive pixel.

In embodiments of the present disclosure, after the pixel values of the photosensitive pixels are obtained, the image can be generated according to the pixel values of respective photosensitive pixels.

In the focusing control method for the dual-core focusing image sensor according to embodiments of the present disclosure, after the focusing control is completed, the array of photosensitive pixels is controlled to enter the imaging mode, the array of photosensitive pixels is controlled to perform exposure, and the pixel values of the array of photosensitive pixels are obtained by reading the output value of the photosensitive pixels, and then the image is generated, which improves the image quality.

Figure 9:
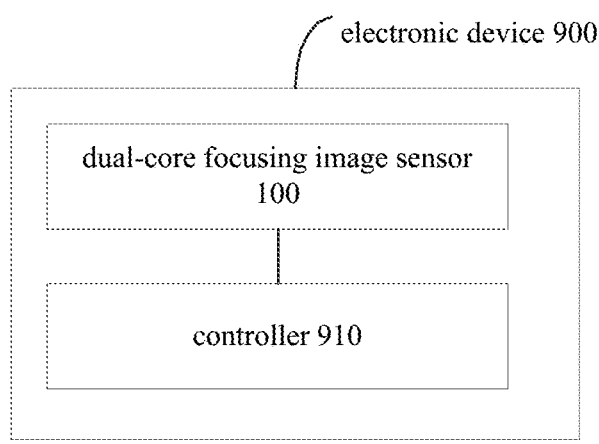
FIG. 9 is a block diagram of an electronic device according to an embodiment of the present disclosure.

In order to implement the above embodiments, the present disclosure further provides an electronic device. FIG. 9 is a block diagram of an electronic device according to an embodiment of the present disclosure.

As illustrated in FIG. 9, the electronic device 900 includes the dual-core focusing image sensor 100 of the above embodiments of the present disclosure and a controller 910.

The controller 910 is configured to control the array of photosensitive pixels to enter a focus mode, read first phase difference information of the focusing photosensitive unit and second phase difference information of the photosensitive pixel corresponding to the second micro lens, and perform focusing control according to the first phase difference information and the second phase difference information.

It should be noted that, in embodiments of the present disclosure, obtaining the first phase difference information of the focusing photosensitive unit may refer to obtain the first phase difference information of the part of the focusing photosensitive unit covered by the white filter unit.

In an embodiment of the present disclosure, the photosensitive pixel in the dual-core focusing image sensor 100 has two photodiodes, which are the first photodiode and the second photodiode. Therefore, the controller 910 is further configured to obtain an output value of the first photodiode as a third output value, obtain an output value of the second photodiode as a fourth output value, and obtain the second phase difference information according to the third output value and the fourth output value.

It should be understood that, the purpose of focusing is to obtain picture with higher definition. In the actual application, after the focusing processing is completed, the imaging processing may be performed. Therefore, in an embodiment of the present disclosure, the controller 910 is further configured to control the array of photosensitive pixels to enter an imaging mode, control the array of photosensitive pixels to perform exposure, obtain pixel values of the array of photosensitive pixels and generate an image.

The pixel values of the part of the focusing photosensitive unit covered by the white filter unit are obtained by an interpolation algorithm. With respect to details of calculating the pixel values, reference may be made to the above description in method embodiments, which will not be elaborated here.

With the electronic device according to embodiments of the present disclosure, by inserting some larger micro lenses in the array of micro lenses and placing the white filter unit on a part of the focusing photosensitive unit, and by reading the first phase difference information of the focusing photosensitive unit and the second phase difference information of the dual-core focus photosensitive pixel, and performing focusing control according to the first phase difference information and the second phase difference information, it is possible to increase the amount of light passing through the focusing pixels, and effectively improve the focusing speed in low light environment, while ensuring the accuracy of color reduction of the image.

Figure 10:
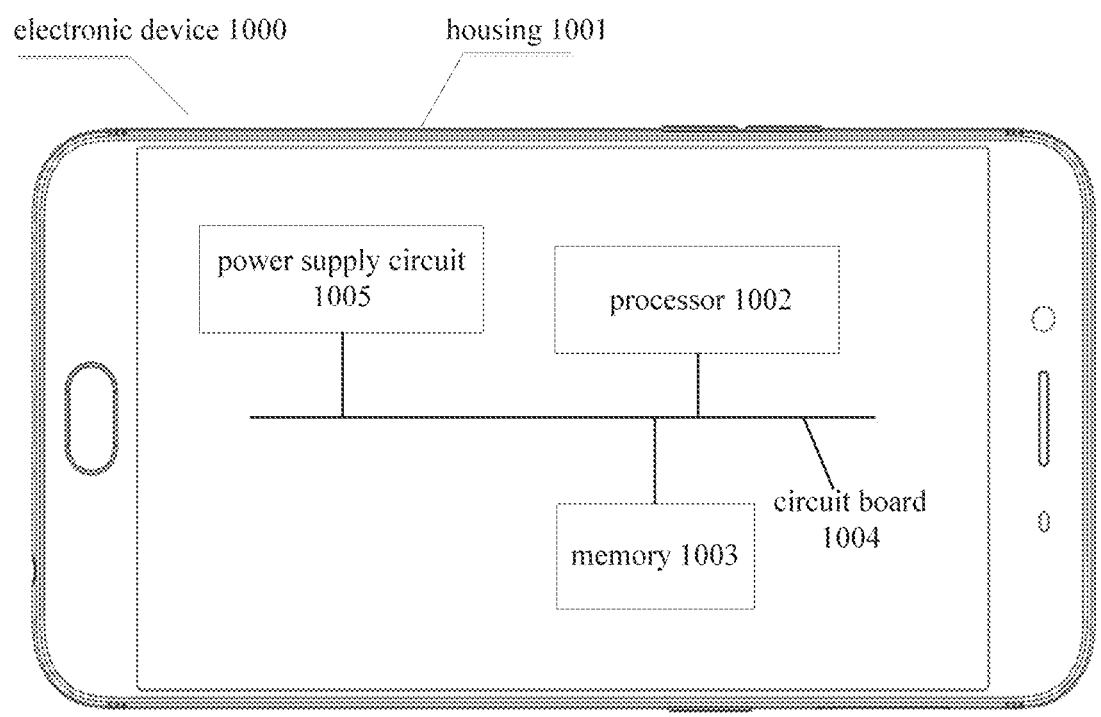
FIG. 10 is a block diagram of an electronic device according to an embodiment of the present disclosure.

In order to implement the above embodiments, the present disclosure further provides an electronic device. FIG. 10 is a block diagram of an electronic device according to an embodiment of the present disclosure.

As illustrated in FIG. 10, the electronic device 1000 includes a housing 1001, a processor 1002, a memory 1003, a circuit board 1004, and a power supply circuit 1005. The circuit board 1004 is arranged inside a space enclosed by the housing 1001. The processor 1002 and the memory 1003 are positioned on the circuit board 1004. The power supply circuit 1005 is configured to provide power for respective circuits or components of the electronic device 1000. The memory 1003 is configured to store executable program codes. The processor 1002 is configured to run a program corresponding to the executable program codes by reading the executable program codes stored in the memory 1003, to perform the focusing control method for the dual-core focusing image sensor according to the above embodiments of the present disclosure.

With the electronic device according to embodiments of the present disclosure, by inserting some larger micro lenses in the array of micro lenses and placing the white filter unit on a part of the focusing photosensitive unit, and by reading the first phase difference information of the focusing photosensitive unit and the second phase difference information of the dual-core focus photosensitive pixel, and performing focusing control according to the first phase difference information and the second phase difference information, it is possible to increase the amount of light passing through the focusing pixels, and effectively improve the focusing speed in low light environment, while ensuring the accuracy of color reduction of the image.

It should be noted that the relational terms herein, such as "first" and "second", are used only for differentiating one entity or operation, from another entity or operation, which, however do not necessarily require or imply that there should be any real relationship or sequence. Moreover, the terms "comprise", "include" or any other variations thereof are meant to cover non-exclusive including, so that the process, method, article or device comprising a series of elements do not only comprise those elements, but also comprise other elements that are not explicitly listed or also comprise the inherent elements of the process, method, article or device. In the case that there are no more restrictions, an element qualified by the statement "comprises a . . . " does not exclude the presence of additional identical elements in the process, method, article or device that comprises the said element.

The logic and/or steps described in other manners herein or shown in the flow chart, for example, a particular sequence table of executable instructions for realizing the logical function, may be specifically achieved in any computer-readable medium to be used by the instruction execution system, device or equipment (such as the system based on computers, the system comprising processors or other systems capable of obtaining the instruction from the instruction execution system, device and equipment and executing the instruction), or to be used in combination with the instruction execution system, device and equipment. As to the specification, "the computer-readable medium" may be any device adaptive for including, storing, communicating, propagating or transferring programs to be used by or in combination with the instruction execution system, device or equipment. More specific examples of the computer-readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device, and a portable compact disk read-only memory (CDROM). In addition, the computer readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

It should be noted that, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples. In addition, in the case that it is not contradictory, a person of skilled in the art can combine different embodiments or examples and the features of different embodiments or examples.

It should noted that, reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples. In addition, different embodiments or examples and features of different embodiments or examples described in the specification may be combined by those skilled in the art without mutual contradiction.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples. In addition, different embodiments or examples and features of different embodiments or examples described in the specification may be combined by those skilled in the art without mutual contradiction.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. A dual-core focusing image sensor, comprising:
an array of photosensitive pixels;
an array of filter units arranged on the array of photosensitive pixels; and
an array of micro lenses arranged above the array of filter units;
wherein, the array of micro lenses comprises a plurality of first micro lenses and density of the plurality of first micro lenses is higher towards a center of the array of micro lenses as compared to a periphery of the array of micro lenses.

2. The dual-core focusing image sensor according to claim 1, wherein each first micro lens corresponding to one focusing photosensitive unit, each focusing photosensitive unit comprising N*N photosensitive pixels, and at least a part of the focusing photosensitive unit being covered by a white filter unit, where N is an even number greater than or equal to 2.

3. The dual-core focusing image sensor according to claim 2, wherein, the white filter unit is configured to cover a right half of left N photosensitive pixels and a left half of right N photosensitive pixels in the focusing photosensitive unit.

4. The dual-core focusing image sensor according to claim 1, wherein the array of micro lenses further comprises a plurality of second micro lenses, and each second micro lens corresponding to one photosensitive pixel.

5. The dual-core focusing image sensor according to claim 1, wherein, the photosensitive pixels are arranged in a Bayer array.

6. The dual-core focusing image sensor according to claim 1, wherein the array of micro lenses comprises a horizontal center line and a vertical center line, and the plurality of first micro lenses comprise:
a first group of first micro lenses arranged along the horizontal center line; and
a second group of first micro lenses arranged along the vertical center line.

7. The dual-core focusing image sensor according to claim 6, wherein the array of micro lenses comprises two diagonals, and the plurality of first micro lenses further comprise:
a third group of first micro lenses arranged along the two diagonals.

8. The dual-core focusing image sensor according to claim 1, wherein the array of micro lenses comprises a plurality of first micro lenses.

9. The dual-core focusing image sensor according to claim 8, wherein density of the plurality of first micro lenses is higher towards a center of the array of micro lenses as compared to a periphery of the array of micro lenses.

10. A dual-core focusing image sensor, comprising:
an array of photosensitive pixels;
an array of filter units arranged on the array of photosensitive pixels; and
an array of micro lenses arranged above the array of filter units, comprising at least one first micro lens and a plurality of second micro lenses, each second micro lens corresponding to one photosensitive pixel, each first micro lens corresponding to one focusing photosensitive unit, each focusing photosensitive unit comprising N*N photosensitive pixels, where N is an even number greater than or equal to 2, wherein a size of each second micro lens is less than a size of each first micro lens.

11. The dual-core focusing image sensor according to claim 10, wherein at least a part of the focusing photosensitive unit is covered by a white filter unit.

12. The dual-core focusing image sensor according to claim 11, wherein the white filter unit is configured to cover a right half of left N photosensitive pixels and a left half of right N photosensitive pixels in the focusing photosensitive unit.

13. The dual-core focusing image sensor according to claim 10, wherein the photosensitive pixels are arranged in a Bayer array.

14. The dual-core focusing image sensor according to claim 10, wherein the array of micro lenses comprises a horizontal center line and a vertical center line, and the plurality of first micro lenses comprise:
a first group of first micro lenses arranged along the horizontal center line; and
a second group of first micro lenses arranged along the vertical center line.

15. The dual-core focusing image sensor according to claim 14, wherein the array of micro lenses comprises two diagonals, and the plurality of first micro lenses further comprise:
a third group of first micro lenses arranged along the two diagonals.

16. An electronic device, comprising:
a dual-core focusing image sensor, comprising:
an array of photosensitive pixels;
an array of filter units arranged on the array of photosensitive pixels; and
an array of micro lenses arranged above the array of filter units;
wherein, the array of micro lenses comprises a plurality of first micro lenses and density of the plurality of first micro lenses is higher towards a center of the array of micro lenses as compared to a periphery of the array of micro lenses.

17. The electronic device according to claim 16, wherein each first micro lens corresponding to one focusing photosensitive unit, each focusing photosensitive unit comprising N*N photosensitive pixels, and at least a part of the focusing photosensitive unit being covered by a white filter unit, where N is an even number greater than or equal to 2.

18. The electronic device according to claim 16, wherein the array of micro lenses further comprises a plurality of second micro lenses, and each second micro lens corresponding to one photosensitive pixel.

19. The electronic device according to claim 16, wherein the array of micro lenses comprises a horizontal center line and a vertical center line, and the plurality of first micro lenses comprise:
a first group of first micro lenses arranged along the horizontal center line; and
a second group of first micro lenses arranged along the vertical center line.

20. The electronic device according to claim 19, wherein the array of micro lenses comprises two diagonals, and the plurality of first micro lenses further comprise:
a third group of first micro lenses arranged along the two diagonals.

* * * * *